United States Patent [19]
Wu

[11] Patent Number: 6,114,811
[45] Date of Patent: Sep. 5, 2000

[54] ELECTROMAGNETIC HIGH-FREQUENCY APPARATUS WITH A TRANSMISSION WALL HAVING ANTENNAS

[76] Inventor: Jeng-Ming Wu, Gustav-Adolf-Strasse 23, D-39106 Magdeburg, Germany

[21] Appl. No.: 09/117,428

[22] PCT Filed: Jan. 31, 1997

[86] PCT No.: PCT/DE97/00185

§ 371 Date: Jul. 30, 1998

§ 102(e) Date: Jul. 30, 1998

[87] PCT Pub. No.: WO97/28555

PCT Pub. Date: Aug. 7, 1997

[30] Foreign Application Priority Data

Feb. 2, 1996 [DE] Germany .............................. 196 03 685

[51] Int. Cl.[7] ...................................................... H05H 1/46
[52] U.S. Cl. ................................ 315/111.21; 315/111.71; 118/723 MW; 118/723 AN; 156/345
[58] Field of Search .......................... 315/111.21, 111.41, 315/111.71; 313/231.31; 118/723 MW, 723 ME, 723 MR, 723 AN, 723 I, 723 IR; 156/345 C, 345 MW, 345 ME

[56] References Cited

U.S. PATENT DOCUMENTS

| 5,149,375 | 9/1992 | Matsuyama | 118/723 AN X |
| 5,637,150 | 6/1997 | Wartski et al. | 118/723 AN |
| 5,700,326 | 12/1997 | Takatsu et al. | 118/723 MW |

FOREIGN PATENT DOCUMENTS

| 94 05 808 | 7/1994 | Germany . | |
| 5-144785 | 6/1993 | Japan | 315/111.21 |

*Primary Examiner*—Justin P. Bettendorf
*Attorney, Agent, or Firm*—Foley & Lardner

[57] ABSTRACT

An electromagnetic radio-frequency or microwave device having a treatment chamber (6) with a transmission wall (7, 7', 7"), which is permeable for the electromagnetic waves, to an adjacent chamber (4) and with a design of the transmission wall (7, 7', 7") for influencing the intensity distribution of the transmission of the electromagnetic waves into the treatment chamber (6) allows low-loss control of the intensity of the transmitted waves in that the transmission wall (7, 7', 7") has a large number of antenna elements (10, 10') which are directed at an angle to the wall plane of the adjacent chamber (4), are in the form of rods, and project centrally through through-openings (14, 14') which are bounded by electrically conductive material.

32 Claims, 13 Drawing Sheets

ELECTROMAGNETIC HIGH-FREQUENCY APPARATUS WITH A TRANSMISSION WALL HAVING ANTENNAS

FIELD OF THE INVENTION

The invention relates to an electromagnetic radio-frequency or microwave device having a treatment chamber with a transmission wall, which is permeable for the electromagnetic waves, to an adjacent chamber and with a design of the transmission chamber for influencing the intensity distribution of the transmission of the electromagnetic waves into the treatment chamber.

BACKGROUND OF THE INVENTION

It is known for the intensity distribution of microwaves which are transmitted through a transmission wall from a chamber into a treatment chamber to be influenced by a special design of the transmission wall. DE 94 05 808 U discloses a plasma processing device in which a plasma is produced in a treatment chamber by means of microwaves that are introduced, for example for surface processing of objects which are introduced into the treatment chamber. In this case, the microwaves are produced in a rectangular hollow waveguide of elongated design, and are output at the side via a waveguide which projects into the hollow waveguide. In this case, the waveguide is designed in the form of a disk and forms a boundary wall for the treatment chamber. In order to introduce the microwave energy uniformly into the treatment chamber, a screen of conductive material is located between the waveguide and the treatment chamber, which screen is designed as a perforated metal sheet, the size of the through-holes increasing as the distance from the hollow waveguide increases, in order in this way to make it possible to compensate for the decrease in the microwave energy as the distance from the hollow waveguide increases.

The use of such a screen as a transmission wall of the treatment chamber leads, however, to a considerable reduction in the microwave energy introduced into the treatment chamber. The introduction of energy into the treatment chamber is thus made uniform at the expense of a considerable reduction in the microwave energy.

It is furthermore known for it to be possible to produce a plasma in a treatment chamber by radio-frequency excitation as well.

SUMMARY OF THE INVENTION

The invention is thus based on the problem of designing an electromagnetic radio-frequency or microwave device of the type mentioned initially such that it is possible to transmit electromagnetic waves into the treatment chamber with a predetermined intensity profile or as uniformly as possible without as a consequence having to accept a considerable reduction in the transmitted electromagnetic energy.

Based on this problem, an electromagnetic radio-frequency or microwave device of the type mentioned initially is characterized in that the transmission wall has a large number of antenna elements which are directed at an angle to the wall plane of the adjacent chamber, are in the form of rods, and project centrally through through-openings which are bounded by electrically conductive material.

According to the invention, the excitation energy is injected from the adjacent chamber into the antenna elements and is emitted by them in the direction of the treatment chamber. Together with the through-openings which surround them and are composed of electrically conductive material, the antenna elements form a type of coaxial conductor. The electromagnetic energy transmitted via the antenna element into the treatment chamber can be adjusted by adjusting the coupling conditions of the antenna elements for the excitation energy in the adjacent chamber.

For the transmission of microwaves, this can be done in a simple manner by means of the length of the antenna elements, which projects out of the through-openings. The through-openings are in this case preferably designed as through-chambers which are connected directly, or with an intermediate space, to a plate, which is permeable for microwaves, of the transmission wall.

It is possible to design the length of the various antenna elements to be different over the surface of the transmission wall in order in this way, if necessary, to unify or produce a desired intensity profile over the area of the transmission wall.

On that surface of the conductive material pointing towards the adjacent chamber, the through-chambers preferably have a circular through-opening with a diameter which is considerably greater than the diameter of the antenna element. The diameter of the through-opening is preferably about 2 to 5 times, furthermore preferably about 3 times, greater than the diameter of the antenna element.

The through-chamber can expand in stepped form underneath the through-opening and can be designed there, for example, with a round or rectangular, preferably square, cross section.

The ratio of the diameter of the through-opening to the diameters of the antenna element likewise allows the transmission of the energy via the transmission wall to be controlled.

In a particularly preferred embodiment, the through-chambers are formed in a common electrically conductive plate.

The transmission according to the invention through the through-wall with the aid of antenna elements can also be used in cascaded form in that the surface of the through-chambers is connected to coupling chambers which are designed as further through-chambers, each centrally have a coupling antenna element, and project into the plurality of antenna elements in the through-chambers. Such an arrangement is expediently designed with two metal plates which rest flat on one another, the number of antenna elements being a multiple of the number of coupling antenna elements. In this case, the coupling chambers are also provided with a circular through-opening, preferably on their surface pointing towards the adjacent chamber, the size of which circular through-opening relative to the diameter of a coupling antenna element allowing the energy transmission to be controlled. The length of the coupling antenna elements can also be used to influence the energy transmission, in a similar manner to that with the antenna elements.

The adjacent chamber, as a transmission chamber, preferably has a longitudinal axis running parallel to the transmission wall, and has at least one waveguide, directed parallel to the longitudinal axis, for injecting microwaves into the adjacent chamber.

The waveguide can in this case preferably be designed in the form of a rod and can project through an opening in a partition wall into a cavity resonator whose longitudinal axis is at right angles to the longitudinal axis of the transmission chamber.

The waveguide ends at a distance from the electrically effective end wall opposite the cavity resonator. The distance between the electrically effective end wall and the waveguide is preferably variable by means of a movable, conductive piston. This takes account of the situation in which the resonance conditions in the transmission chamber are very greatly changed by varying the length of the antenna elements, which can be compensated for by moving the conductive piston as the electrically effective end wall.

It is also possible to arrange a plurality of waveguides parallel to one another in the transmission chamber and to allocate compartments to the waveguides by means of conductive intermediate walls. This on its own allows the microwave energy to be injected in a uniform manner into the transmission chamber. Symmetrical arrangements of antenna elements of the transmission wall are expediently allocated to each waveguide within the compartments. In this case, in each case one piston, which acts as an end wall, is expediently arranged movably within the individual compartments.

In order to excite the plasma with radio-frequency energy (in the general MHz band below microwave frequency), it is advantageous if the antenna elements are angled, run with an angled end essentially parallel to the inner conductor of a coaxial conductor which is formed in the adjacent chamber, project with the other end through the through-wall into the treatment chamber, and are arranged there at a distance from a common opposing electrode, which is at the same potential as the outer conductor. In this case, the antenna elements which project through the through-wall may expediently have end pieces which are formed parallel to the opposing electrode. In this case as well, the antenna elements expediently form a coaxial conductor section with through-chambers composed of conductive material, through which coaxial conductor section the radio-frequency energy is transmitted well. Selection of the distance and the length of the angled end of the antenna element with respect to the coaxial conductor allows the injection condition to be selected and the amount of excitation energy transmitted at the point of the respective antenna element to be adjusted.

The treatment chamber is preferably designed as a vacuum chamber, the arrangement preferably being used as a plasma treatment arrangement. In this case, a treatment table may be designed to the height adjustable within the treatment chamber, in a manner known per se.

In particular for hard vacuums, it may be expedient for coil arrangements to be provided on the outside of the treatment area in order to form a magnetic field, in order to use the influence of the magnetic field to increase the probability of collisions between gas particles and thus to improve the capability to ignite the plasma. In this case, it may be expedient to arrange a plurality of permanent magnets underneath the treatment table.

For certain applications in the plasma, it may be expedient to arrange a negatively charged screen between the treatment table and the transmission wall as an electron trap, through which only ions pass for plasma treatment.

BRIEF DESCRIPTION OF THE DRAWINGS

The invention will be explained in more detail in the following text with reference to exemplary embodiments which are illustrated in the drawing, in which.

DESCRIPTION OF THE INVENTION

Figure 1:
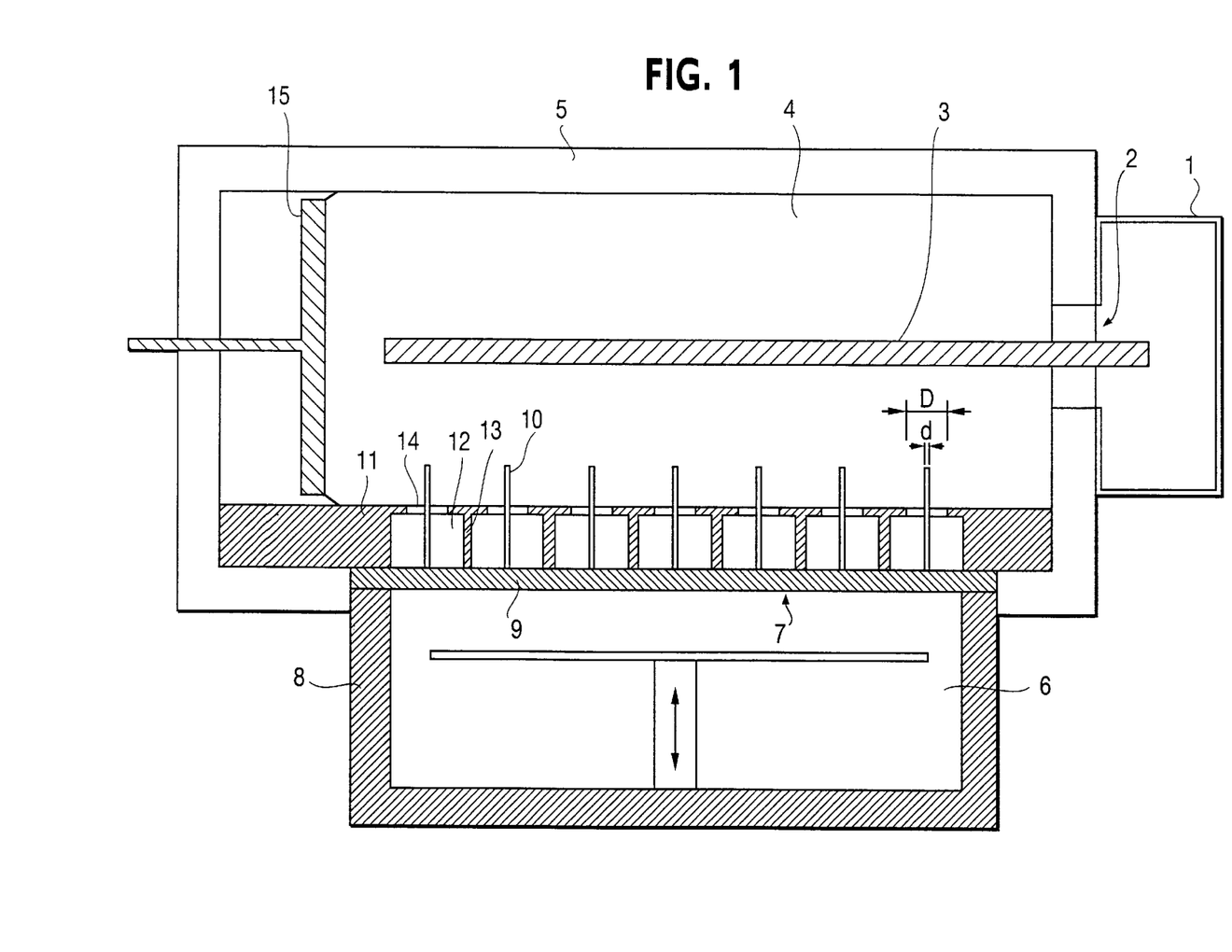
FIG. 1 shows a vertical section through a microwave device according to the invention.

FIG. 1 shows an arrangement in which microwaves are produced in a hollow waveguide 1 having a rectangular cross section. The microwaves are output through a side opening 2 in the hollow waveguide 1 with the aid of at least one waveguide 3 in the form of a rod, and are introduced into a transmission chamber 4. The transmission chamber 4 is essentially bounded by metallic walls 5. A treatment chamber 6 projects into a recess located on one longitudinal side of the rectangular transmission chamber 4 and, with the exception of the wall 7 pointing towards the adjacent transmission chamber 4, is bounded on all sides by metallic walls 8. The treatment chamber 6 is designed as a vacuum chamber. The transmission wall 7 comprises a plate 9 which is permeable for microwaves, a large number of antenna elements 10 which extend at right angles to the permeable plate 9 into the transmission chamber 4, as well as a metallic plate 11 which extends over the entire longitudinal side of the transmission chamber 4. Through-chambers 12 are formed in the metallic plate 11, are open towards the permeable plate 9, and are thus bounded by it. At the sides, the square through-chambers are bounded by thin walls 13, designed in the form of grids, of the metallic plate 11. Located on the surface is a circular through-opening 14 of roughly the same thickness as the walls 13, the through-openings 14 having a diameter D which is between 2 and 5 times as great as the diameter d of the antenna elements 10, which are arranged centrally in the through-opening 14 and in the through-chamber 12.

The antenna elements 10 project to a certain extent over the metal plate 11 into the transmission chamber 4, in which case it is possible to influence the amount of injected microwave energy by means of the length of the antenna elements.

The antenna elements 10 are preferably kept available in different lengths and are used experimentally in different lengths in order to achieve an optimized configuration. Changing to an antenna element 10 having a different length immediately and dramatically changes the resonance condition in the transmission chamber 4. In order to allow adaptations to be carried out in each case here, the transmission chamber 4 is provided on the side opposite the hollow waveguide 1 with a movable metallic piston 15, by means of which an optimum resonance condition can be set empirically once again in the transmission chamber 4.

Figure 2:
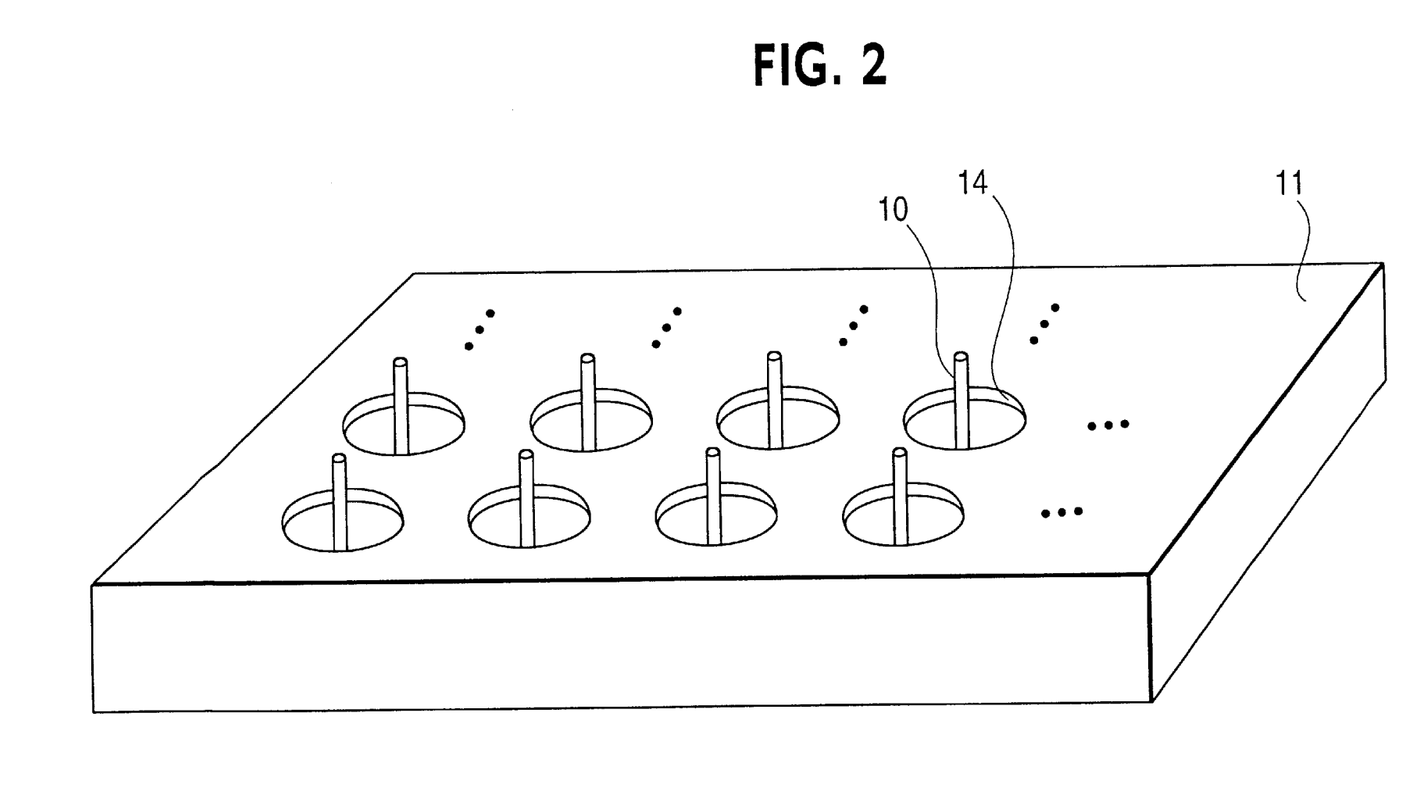
FIG. 2 shows a perspective view of a metal plate which is provided with through-chambers and has antenna elements inserted centrally.

FIG. 2 shows the metallic plate 11 with its circular through-openings 14 on the surface. The antenna elements 10, which are in the form of rods, are inserted centrally into the circular through-openings 14.

Figure 3:
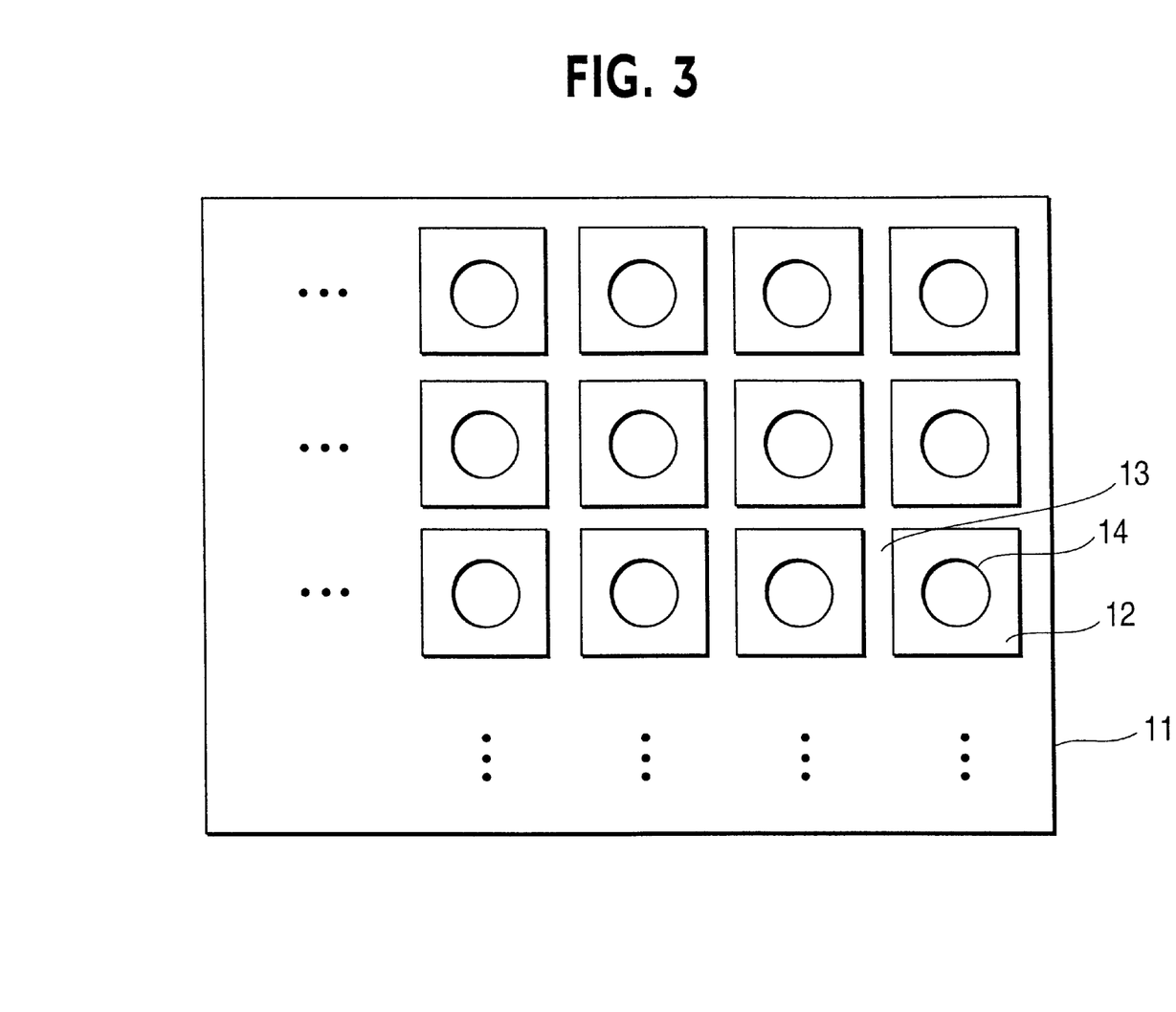
FIG. 3 shows a schematic view of the underneath of the metal plate according to FIG. 2, without antenna elements.

The view of the underneath of the metallic plate 11 according to FIG. 3 shows that the through-chambers 12 have a square cross section and expand in stepped form underneath the through-opening 14. The through-chambers 12 are bounded by the walls 13 designed in the form of grids.

Figure 4:
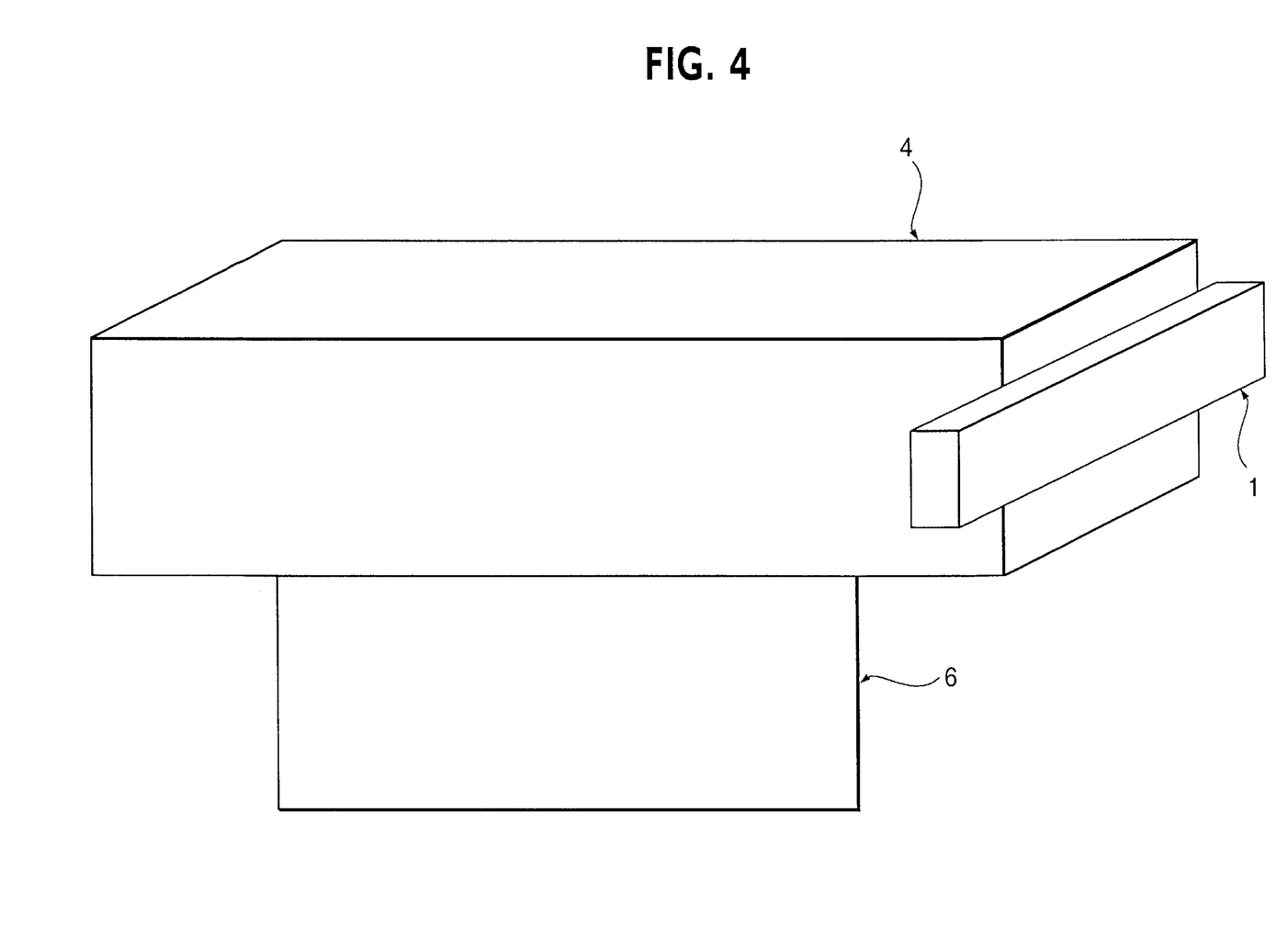
FIG. 4 shows a perspective, schematic illustration of the microwave device according to FIG. 1.

FIG. 4 shows the schematic arrangement of the hollow waveguide 1, transmission chamber 4 and treatment chamber 6, which are all respectively designed to be cuboid.

Figure 5:
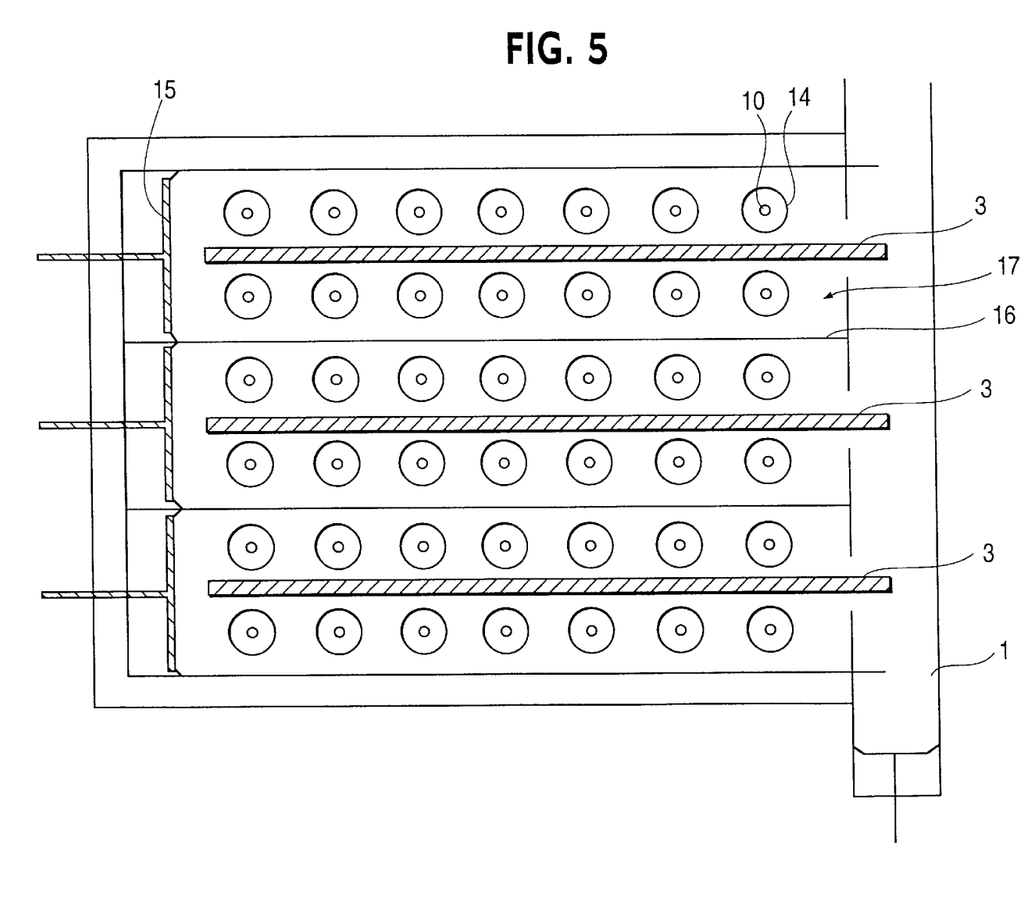
FIG. 5 shows a horizontal section through a transmission chamber having a plurality of waveguides arranged parallel to one another.

FIG. 5 shows a modified exemplary embodiment, in which three waveguides 3 project into the hollow waveguide in arrangements that are parallel to one another and parallel to the transmission wall 7, these waveguides 3 extending over the length of the transmission chamber 4. FIG. 5 shows that each waveguide 3 is allocated on each of its two sides a row of circular through-openings 14 with antenna elements 10, the symmetrical arrangement on both sides of the waveguide 3 being a major feature. Conductive intermediate walls 16 are used to form compartments for each waveguide 3, and these compartments preclude any mutual influence between the antenna elements 10 through a plurality of waveguides 3.

A movable piston 15 is provided as an electrically effective end wall for each compartment 17.

Figure 6:
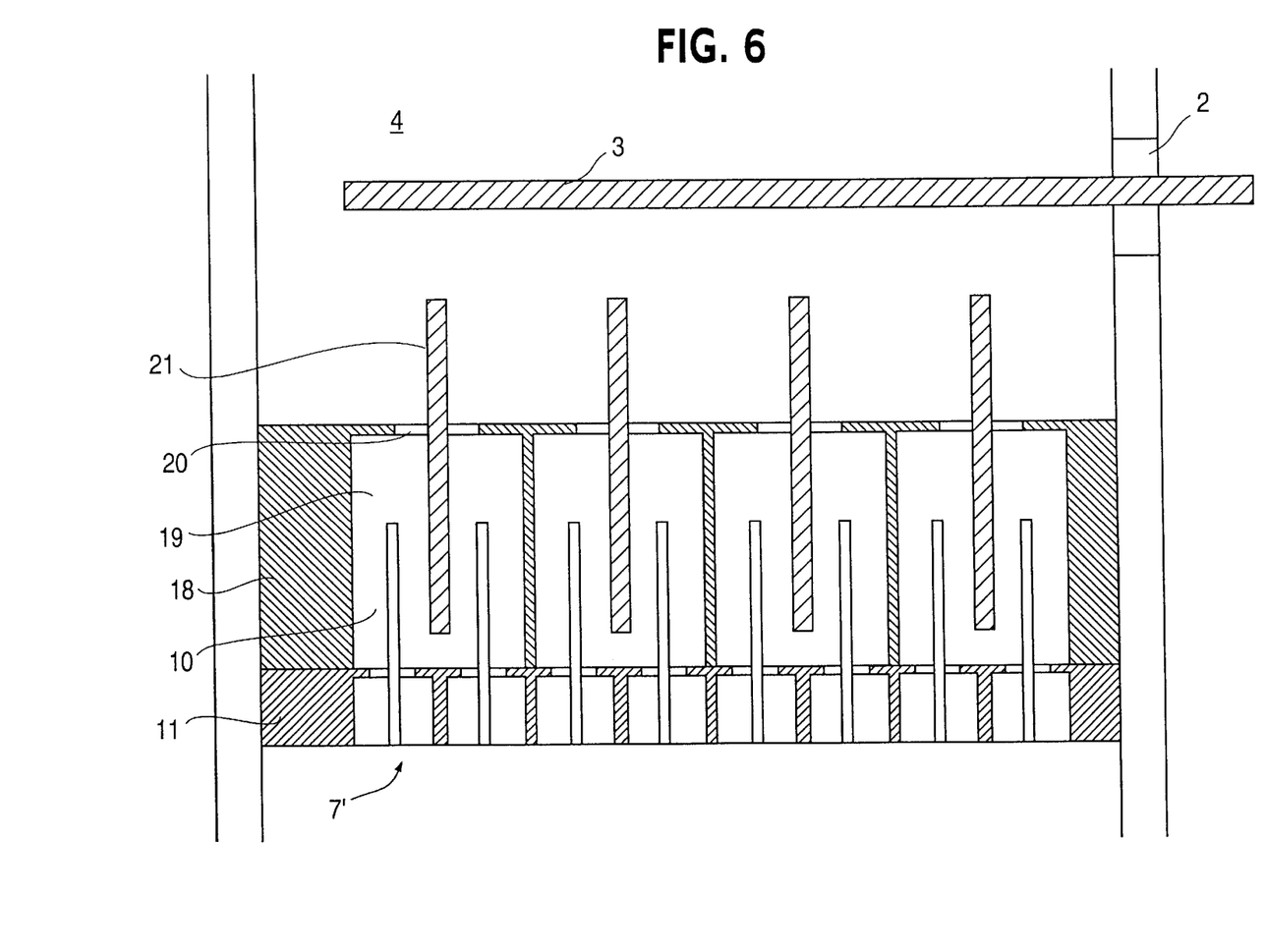
FIG. 6 shows a schematic illustration of a transmission wall having cascaded antenna elements and through-chambers.

FIG. 6 shows a cascaded design of the transmission wall 7'. A further metallic plate 18 is in this case placed on the metallic plate 11 and is provided with similar through-chambers 19 and circular through-openings 20. A coupling antenna element 21 is inserted centrally into the through-chamber 19 and the through-opening 20, projects out of the through-chamber 19 into the transmission chamber 4, and naturally ends at a distance from the surface of the metallic plate 11.

Figure 6A:
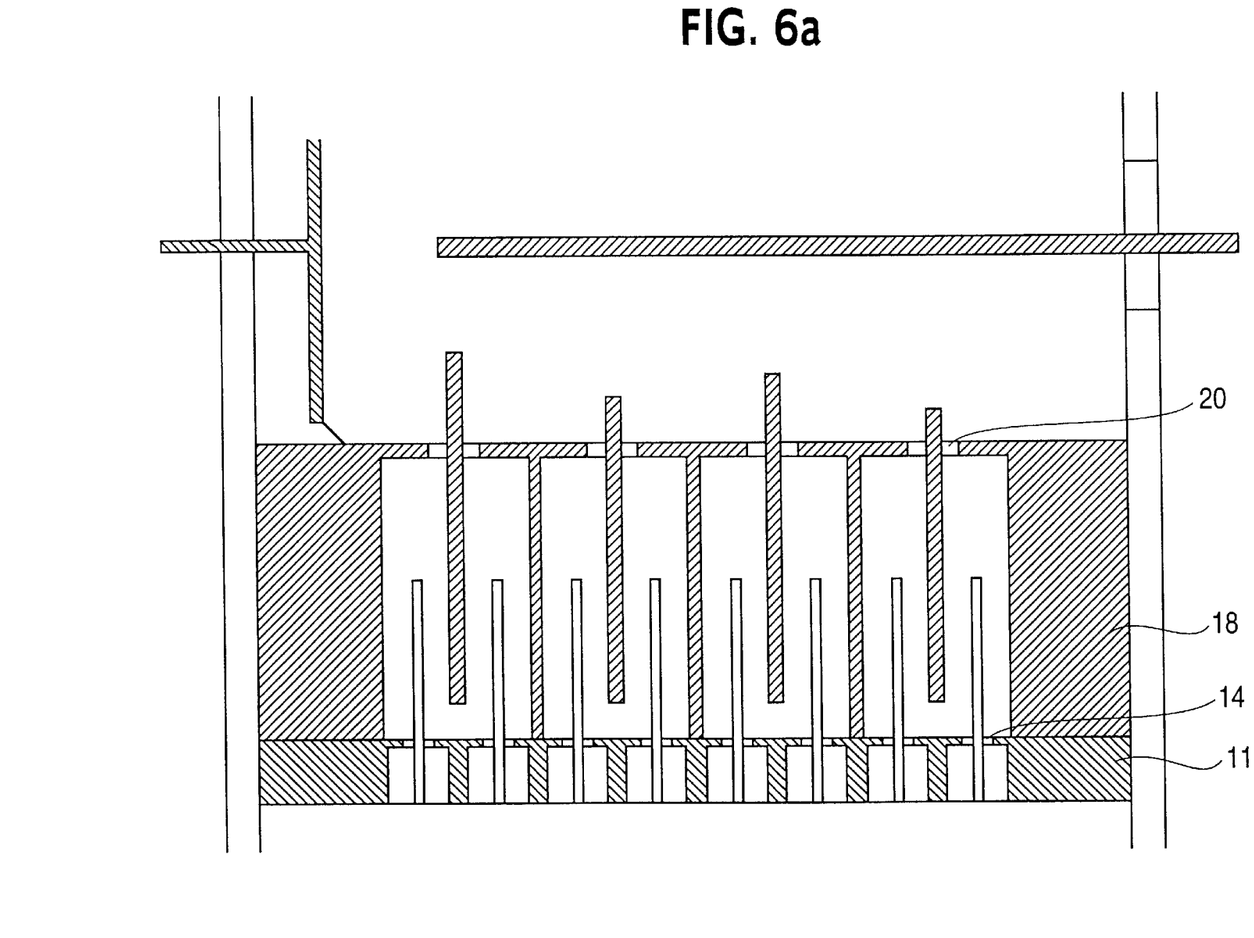
FIG. 6a shows a variant of the embodiment according to FIG. 6.

As can be seen, a plurality of antenna elements 10 project into the through-chamber 19, for example four antenna elements 10 in a symmetrical arrangement with respect to the central coupling antenna element 21. The advantage of this arrangement is that it results in the microwave energy being transmitted uniformly through the numerous antenna elements 10, but the adjustment tasks need be carried out only with the coupling antenna elements 21 (in particular by means of their length), while the antenna elements 10 can be designed to have the same length, that is to say they no longer need be adjusted (FIG. 6a). The adjustment of the considerably smaller number of coupling antenna elements 21 is, however, sufficient to take account of homogeneous transmissions from the transmission chamber 4.

Figure 7:
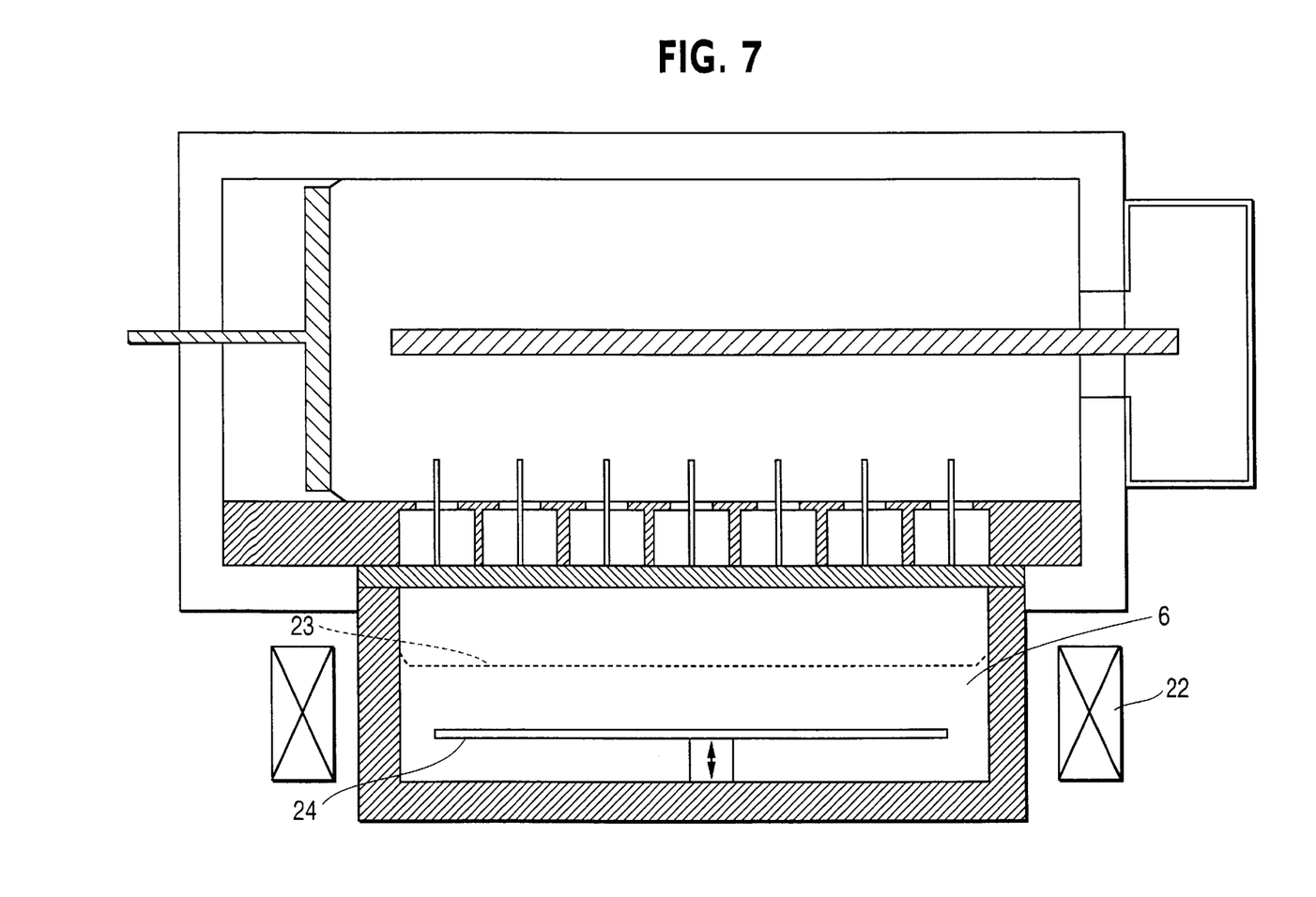
FIG. 7 shows an arrangement according to FIG. 1 having an electrode trap in the treatment chamber and excitation coils for a magnetic field.

FIG. 7 shows the arrangement according to FIG. 1, but with a coil arrangement 22 being provided around the treatment chamber 6 in order to form a magnetic field in the treatment chamber 6. The magnetic field considerably increases the number of collisions between gas particles, so that plasma ignition can be achieved even in a hard vacuum.

Furthermore, the treatment chamber 6 is provided with a grid 23, in the form of a screen, between the transmission wall 7 and a treatment table 24. The grid 23 has a negative voltage applied to it, so that it traps electrons and allows only ions to pass through. In this way, the arrangement is used as an ion source for treatment of products that are placed on the treatment table 24.

Figure 8:
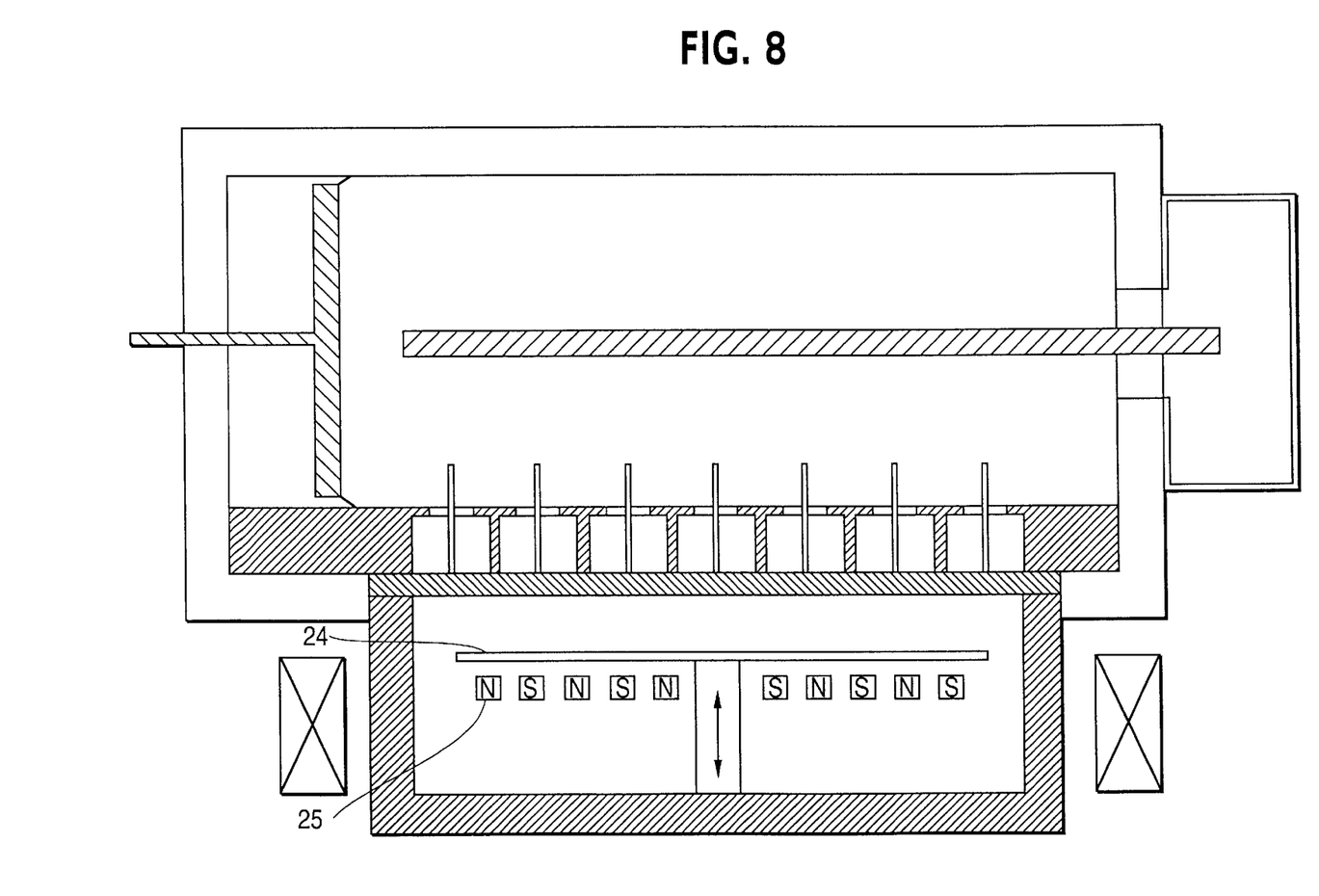
FIG. 8 shows an arrangement according to FIG. 1 having a coil arrangement for producing a magnetic field and having an arrangement of permanent magnets underneath the treatment table.

In the case of the embodiment illustrated in FIG. 8, an arrangement comprising numerous permanent magnets 25, of alternately opposite polarity, is located underneath the treatment table. This achieves local compression of the plasma, which assists ignition of the plasma.

Figure 9:
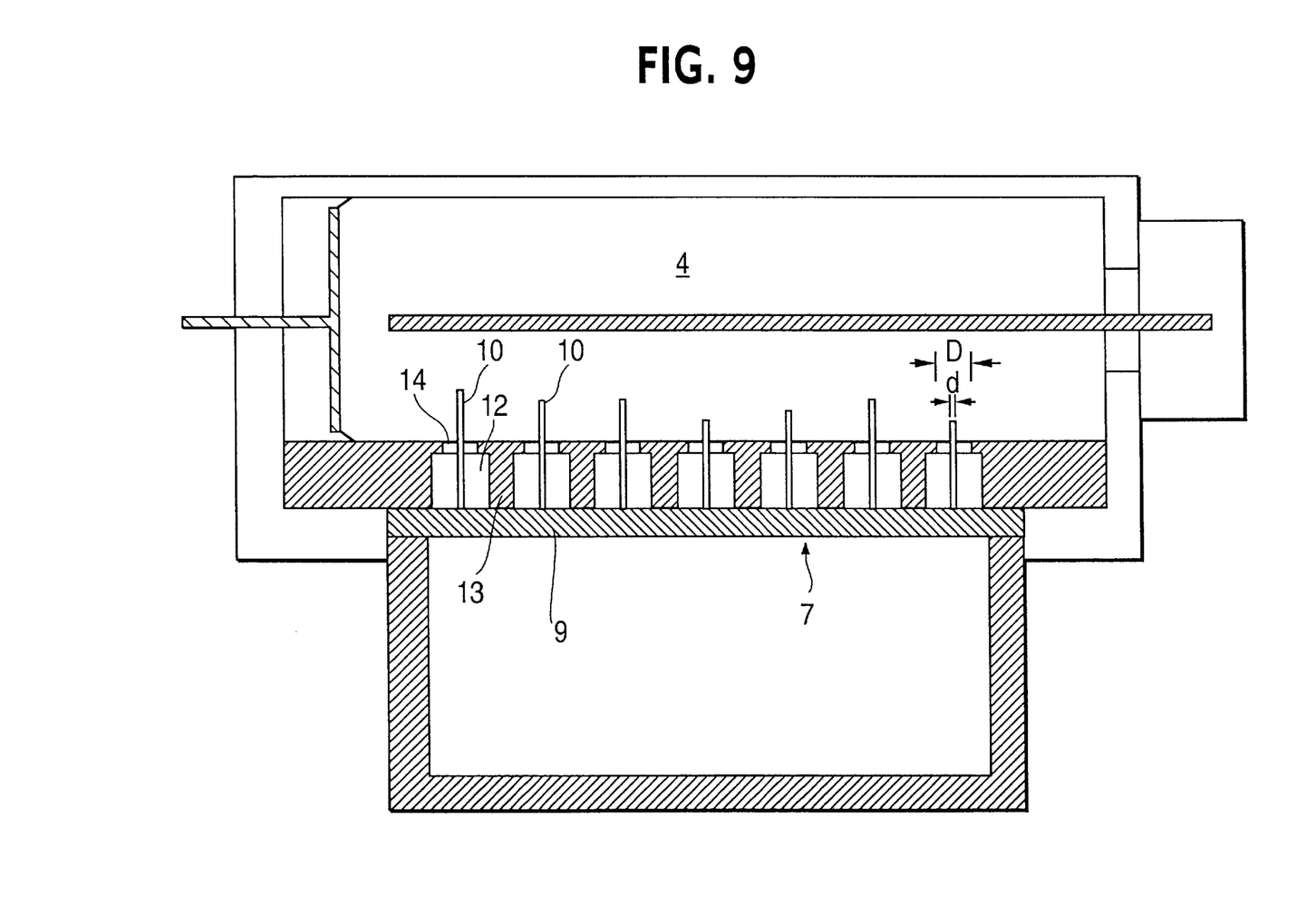
FIG. 9 shows a variant of the design of the transmission wall relating to the embodiment according to FIGS. 1, 7 and 8.

In the case of the embodiment illustrated in FIG. 9, the antenna elements 10 are designed with different lengths and all end at the plate 9, which is permeable for microwaves, of the transmission wall 7. The antenna elements project with different lengths out of the through-openings 14. The injection of the microwave energy, which is introduced into the chamber 4, into the antenna elements 10 can be regulated by means of the projecting length of the antenna elements. Otherwise, the antenna elements 10 are located in through-chambers 12, which are bounded by the walls 13.

Figure 10:
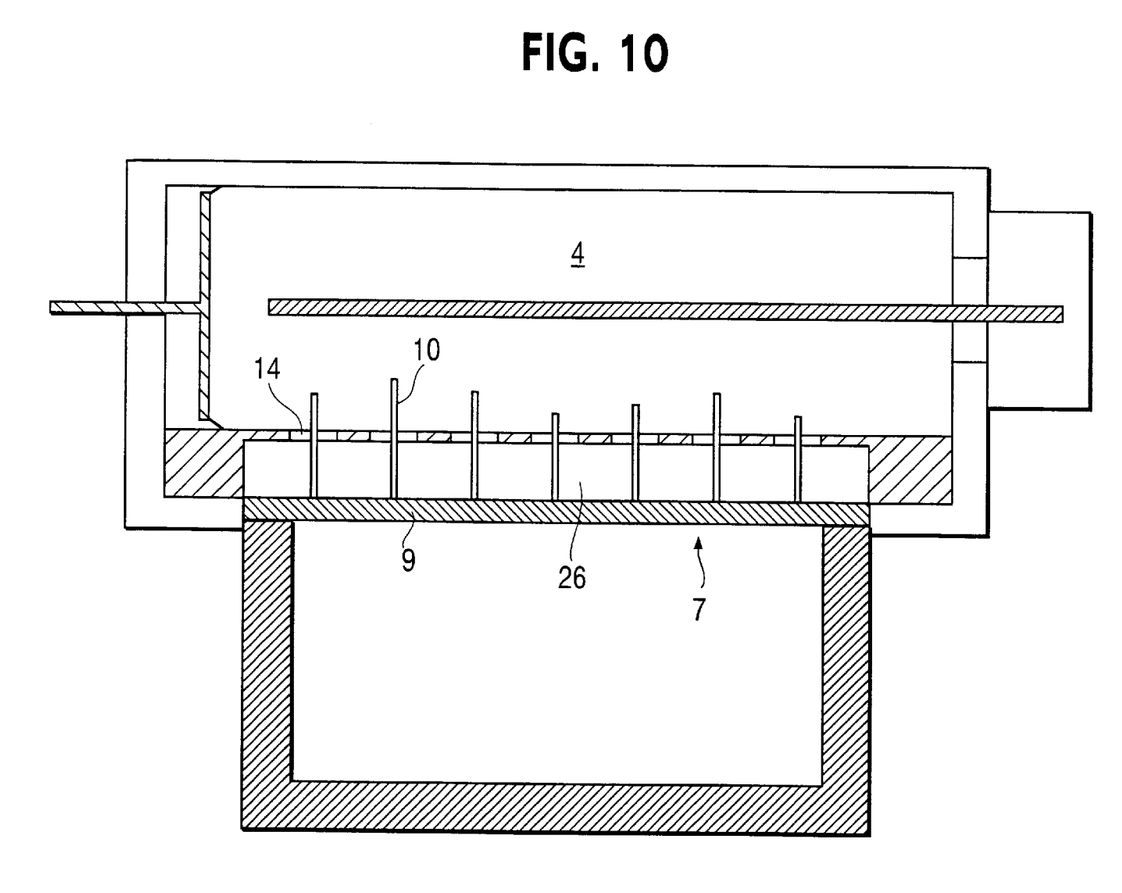
FIG. 10 shows a further variant of the transmission wall.

In the case of the embodiment illustrated in FIG. 10, the antenna elements 10 project with different lengths out of the through-openings 14 in the direction of the chamber 4, but run between the through-openings 14 and the microwave-permeable plate 9 of the transmission wall 7 in a common intermediate space 26, which is produced by the fact that the intermediate walls 13 according to the exemplary embodiments illustrated in FIGS. 1, 7, 8 and 9 are omitted.

Figure 11:
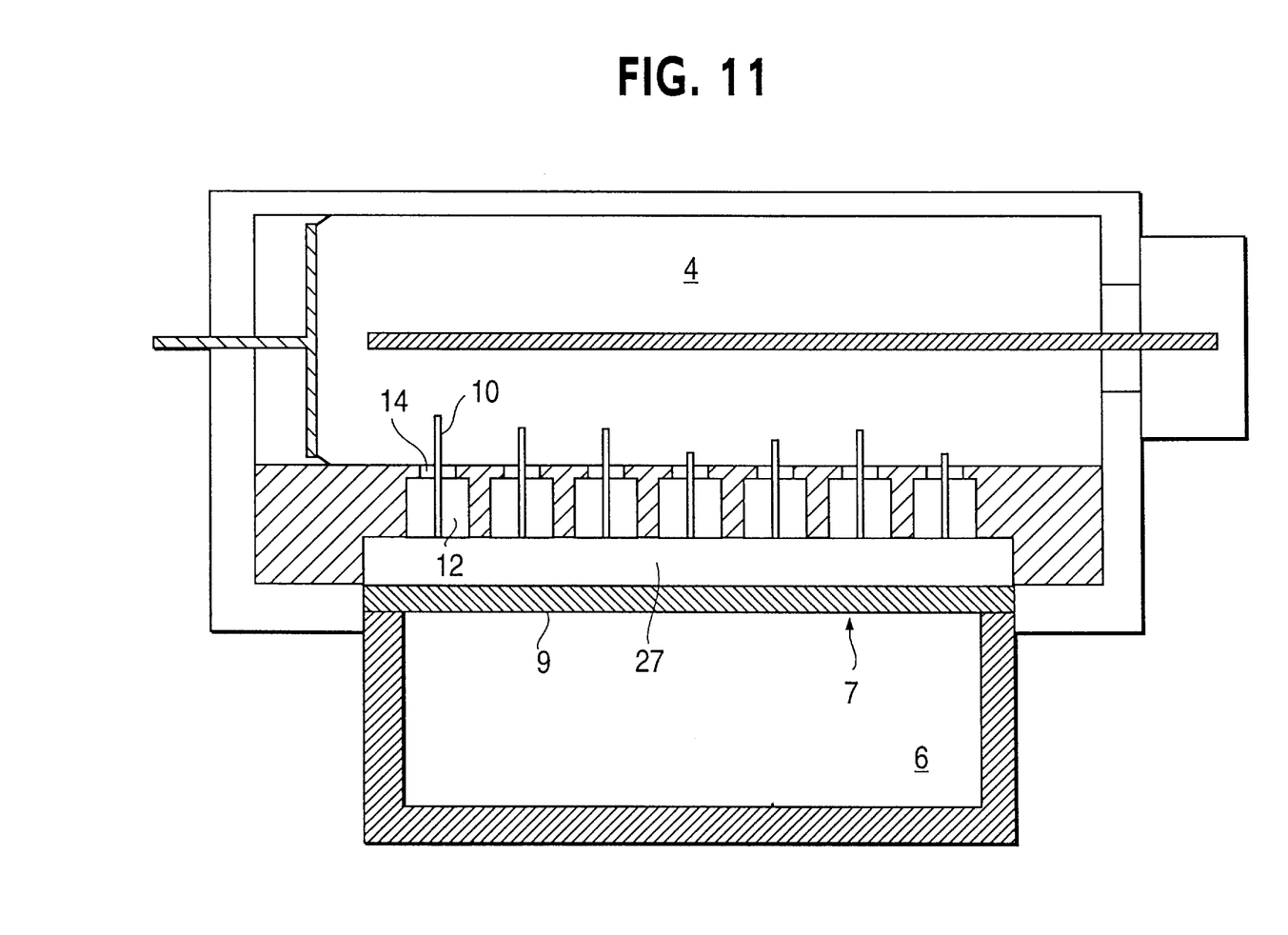
FIG. 11 shows yet another variant of the transmission wall.

FIG. 11 shows an exemplary embodiment in which the antenna elements 10 have through-openings 14 and through-chambers 12 passing through them, a common intermediate space 27 being formed, however, between the through-chambers 12 and the plate 9, which is permeable to microwaves, of the transmission wall 7, into which intermediate space 27 the antenna elements 10 likewise project with different lengths according to this exemplary embodiment. This makes it possible to control not only the microwave energy injected into the antenna elements from the chamber 4, but also the microwave energy emitted into the treatment chamber 6.

Figure 12:
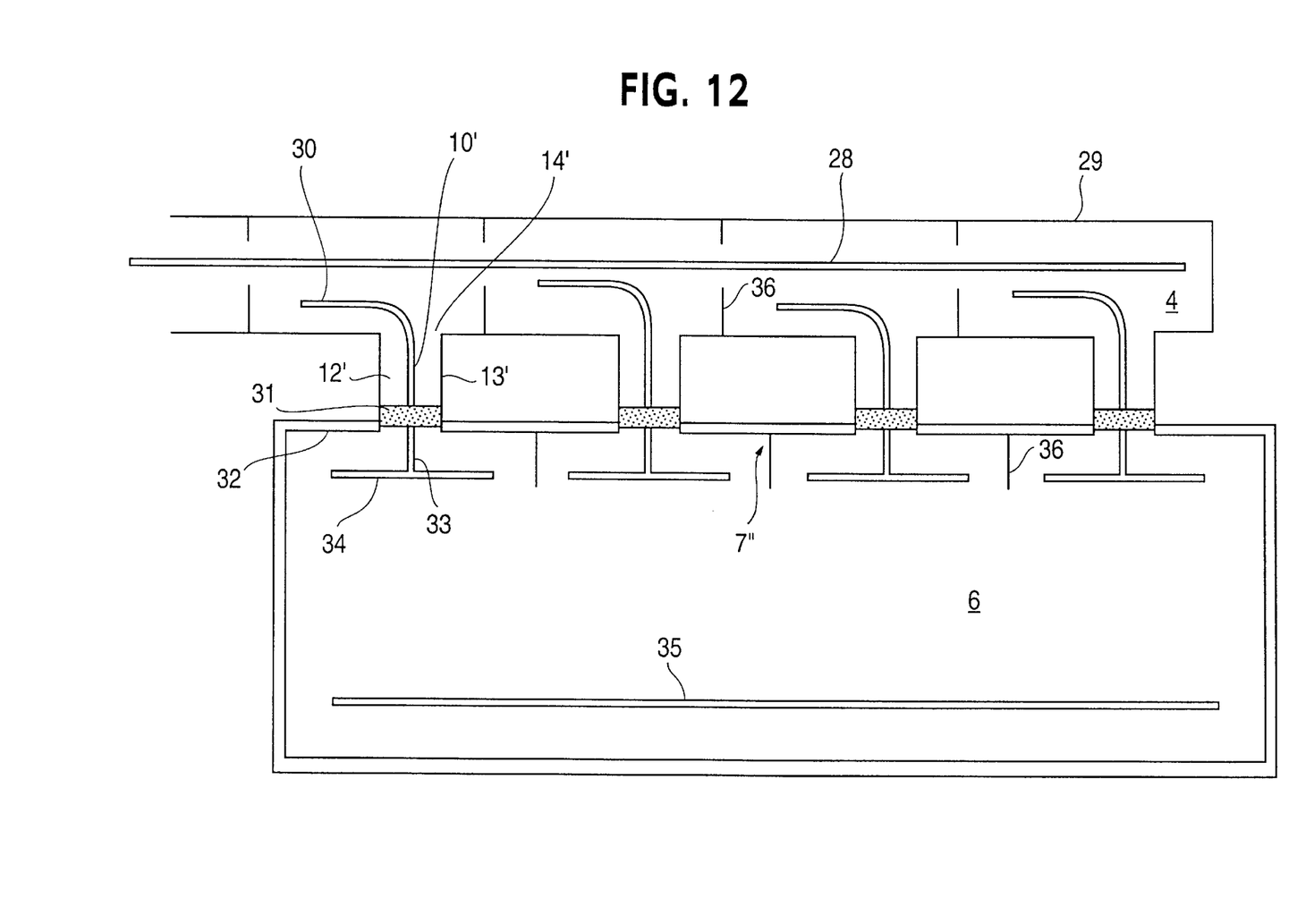
FIG. 12 shows a schematic illustration of a treatment device according to the invention designed for radio-frequency excitation.

FIG. 12 shows a schematic illustration for excitation of the plasma in the treatment chamber 6 by means of electromagnetic radio-frequency energy whose frequency is thus below microwave frequency. For this purpose, the adjacent chamber 4 is designed as a type of coaxial conductor having an inner conductor 28 which extends over the length of the chamber 4 and having a rectangular casing 29 which surrounds the inner conductor 28 at a distance from it and is composed of electrically conductive material.

Antenna elements 10' likewise project at right angles to a transmission wall 7" between the adjacent chamber 4 and the treatment chamber 6. Within the adjacent chamber 4, the antenna elements 10' have angled ends 30, which run essentially parallel to the inner conductor 28. The antenna elements 10' have throughchambers 12' passing through them, and these throughchambers 12' are bounded by electrically conductive walls 13'.

Located within the through-chambers 12' are sealing pieces 31 which are composed of dielectric material and have no adverse effect on radio-frequency conduction. The sealing pieces 31 run essentially aligned with walls 32 which bound the treatment chamber 6 and are composed of electrically conductive material. The antenna elements 10' have sealing pieces 31 passing through them, and their ends 33 project into the treatment chamber 6. End pieces 34 are integrally formed at the ends 33 and run essentially parallel to a common opposing electrode 35, which is at ground potential.

In order to reduce the mutual influence between the antenna elements 10', compartment walls 36 are located both within the chamber 4 and within the treatment chamber 6 and shield the ends 30 and 34 of the antenna elements 10' from one another.

A plasma is produced by means of radio-frequency excitation in the treatment chamber 6, which is sealed in a gas-tight manner by the walls 32 and the sealing pieces 31, in which case it is possible to make the plasma uniform and to set a desired energy profile by virtue of the nature of the injection of radio-frequency energy into the antenna elements 10' via the bent ends 30.

What is claimed is:

1. An electromagnetic high-frequency device comprising:
    a generator for generating electromagnetic waves;
    a treatment chamber;
    an adjacent chamber which is arranged adjacent to said treatment chamber and in which said electromagnetic waves are guided; and
    a transmission wall disposed between said treatment chamber and said adjacent chamber, permeable to said electromagnetic waves and designed to influence an intensity distribution of transmission of said electromagnetic waves from said adjacent chamber into said treatment chamber;
    wherein said transmission wall comprises a plurality of antenna elements which are directed at an angle to a wall plane of said adjacent chamber, extend into said adjacent chamber, are in the form of rods, and project centrally through through-openings which are bounded by electrically conductive material, and
    wherein said transmission wall has a plate which is permeable to electromagnetic waves and a plate which is composed of electrically conductive material and in which the through-openings are located.

2. An electromagnetic high-frequency device according to claim 1, wherein a plasma is formed in the treatment chamber (6).

3. An electromagnetic high-frequency device according to claim 1, wherein a common intermediate area is formed between the through-openings and the plate which is permeable to electromagnetic waves.

4. An electromagnetic high-frequency device according to claim 1, wherein through-chambers are formed between through-openings and the plate which is permeable to electromagnetic waves.

5. An electromagnetic high-frequency device according to claim 4, wherein a common intermediate area is formed between the through-chambers and the plate which is permeable to electromagnetic waves.

6. An electromagnetic high-frequency device according to claim 4, wherein the through-chambers are formed in a common electrically conductive plate.

7. An electromagnetic high-frequency device according to claim 4, wherein, on that surface of the conductive material pointing towards the adjacent chamber, the through-chambers have a circular through-opening with a diameter (D) which is greater than the diameter (d) of the antenna element.

8. An electromagnetic high-frequency according to claim 7, wherein the diameter (D) of the through-opening is approximately 2 to 5 times greater than the diameter (d) of the antenna element.

9. An electromagnetic high-frequency device according to claim 8, wherein the diameter of the through-opening is approximately 3 times greater than the diameter of the antenna element.

10. An electromagnetic high-frequency device according to claim 7, wherein the through-chamber has a rectangular cross section following the through-opening.

11. An electromagnetic high-frequency device according to claim 10, wherein the through-chamber has a square cross section following the through-opening.

12. An electromagnetic high-frequency device according to claim 7, wherein the through-chambers expand in stepped form towards the permeable plate following the through-opening.

13. An electromagnetic high-frequency device according to claim 4, wherein the antenna elements project from the surface of the through-chambers.

14. An electromagnetic high-frequency device according to claim 1, wherein the antenna elements are at right angles to the permeable plate.

15. An electromagnetic high-frequency device according to claim 1, characterized in that the length of various antenna elements (10) is designed to be different over the surface of the transmission wall (7).

16. An electromagnetic high-frequency device according to claim 1, characterized in that the treatment chamber (6) is designed as a vacuum chamber.

17. An electromagnetic high-frequency device according to claim 1, characterized in that the adjacent chamber (4), as a transmission chamber, has a longitudinal axis running parallel to the transmission wall (7), and has at least one waveguide (3), directed parallel to the longitudinal axis, for injecting electromagnetic waves into the adjacent chamber (4).

18. An electromagnetic high-frequency device according to claim 17, characterized in that the waveguide (3) is designed in the form of a rod and projects through an opening (2) in a partition wall into a hollow waveguide (1) whose longitudinal axis is at right angles to the longitudinal axis of the transmission chamber (4).

19. An electromagnetic high-frequency device according to claim 18, characterized in that the waveguide (3) ends at a distance from the end wall opposite the hollow waveguide (1) and in that the distance to the electrically effective end wall is variable by means of a movable, conductive piston (15).

20. An electromagnetic high-frequency device according to claim 1, characterized in that a treatment table (24) is designed to be height adjustable within the treatment chamber (6).

21. An electromagnetic high-frequency device according to claim 20, characterized by a screen (23) which is arranged between the treatment table (24) and the transmission wall (7, 7') as an electron trap.

22. An electromagnetic high-frequency device according to claim 1, characterized in that coil arrangements (22) are provided on the outside of the treatment chamber (6) in order to form a magnetic field.

23. An electromagnetic high-frequency device according to claim 1, characterized in that an arrangement of a plurality of permanent magnets (25) is arranged in the treatment chamber (6).

24. An electromagnetic high-frequency device comprising:
    a generator for generating electromagnetic waves;
    a treatment chamber;
    an adjacent chamber which is arranged adjacent to said treatment chamber and in which said electromagnetic waves are guided; and
    a transmission wall disposed between said treatment chamber and said adjacent chamber, permeable to said electromagnetic waves and designed to influence an intensity distribution of transmission of said electromagnetic waves from said adjacent chamber into said treatment chamber;

wherein said transmission wall comprises a plurality of antenna elements which are directed at an angle to a wall plane of said adjacent chamber, extend into said adjacent chamber, are in the form of rods, and project centrally through through-openings which are bounded by electrically conductive material, and wherein the antenna elements are angled, run with an angled end essentially parallel to the inner conductor of a coaxial conductor which is formed in the adjacent chamber, project with the other end through the transmission wall into the treatment chamber, and are arranged there at a distance from a common opposing electrode, which is at the same potential as the outer conductor.

25. An electromagnetic high-frequency device according to claim 24, wherein the antenna elements have passing through them through-chambers composed of conductive material.

26. An electromagnetic high-frequency device according to claim 24, wherein the antenna elements which project through the transmission wall have end pieces which are formed parallel to the opposing electrode.

27. An electromagnetic high-frequency device comprising:

a generator for generating electromagnetic waves;

a treatment chamber;

an adjacent chamber which is arranged adjacent to said treatment chamber and in which said electromagnetic waves are guided; and a transmission wall disposed between said treatment chamber and said adjacent chamber, permeable to said electromagnetic waves and designed to influence an intensity distribution of transmission of said electromagnetic waves from said adjacent chamber into said treatment chamber;

wherein said transmission wall comprises a plurality of antenna elements which are directed at an angle to a wall plane of said adjacent chamber, extend into said adjacent chamber, are in the form of rods, and project centrally through through-openings which are bounded by electrically conductive material, and wherein the through-openings are connected to coupling chambers which are designed as further through-chambers, each centrally have a coupling antenna element, and project into the plurality of antenna elements.

28. An electromagnetic high-frequency device according to claim 27, wherein, on their surface pointing towards the adjacent chamber, the coupling chambers also have a circular through-opening.

29. An electromagnetic high-frequency device according to claim 28, wherein the coupling antenna elements are designed with different lengths and project out of their through-openings.

30. An electromagnetic high-frequency device comprising:

a generator for generating electromagnetic waves;

a treatment chamber;

an adjacent chamber which is arranged adjacent to said treatment chamber and in which said electromagnetic waves are guided; and a transmission wall disposed between said treatment chamber and said adjacent chamber, permeable to said electromagnetic waves and designed to influence an intensity distribution of transmission of said electromagnetic waves from said adjacent chamber into said treatment chamber;

wherein said transmission wall comprises a plurality of antenna elements which are directed at an angle to a wall plane of said adjacent chamber, extend into said adjacent chamber, are in the form of rods, and project centrally through through-openings which are bounded by electrically conductive material, wherein the adjacent chamber, as a transmission chamber, has a longitudinal axis running parallel to the transmission wall, and has at least one waveguide, directed parallel to the longitudinal axis, for injecting electromagnetic waves into the adjacent chamber, and wherein a plurality of waveguides project parallel to one another into the transmission chamber, and in that compartments are allocated to the waveguides by means of conductive intermediate walls.

31. An electromagnetic high-frequency device according to claim 30, wherein, within the compartments, symmetrical arrangements of antenna elements are allocated to each waveguide.

32. An electromagnetic high-frequency device according to claim 30, wherein a piston which acts as an end wall is in each case arranged movably within the compartments.

* * * * *